US012719525B2

United States Patent
(12) United States Patent
Mankowski et al.

(10) Patent No.: US 12,719,525 B2
(45) Date of Patent: Aug. 25, 2026

(54) METHODS AND SYSTEMS FOR OPERATING AN ELECTRIC VEHICLE

(71) Applicant: ACCELERATED SYSTEMS INC., Waterloo (CA)

(72) Inventors: Peter Mankowski, Waterloo (CA); Willem Jager, Waterloo (CA); Andrei Buin, Waterloo (CA); Lucas Coelho, Waterloo (CA); Daniel Hailu, Waterloo (CA); Muhammad Ikhlas, Waterloo (CA)

(73) Assignee: Accelerated Systems Inc., Waterloo (CA)

( * ) Notice: Subject to any disclaimer, the term of this patent is extended or adjusted under 35 U.S.C. 154(b) by 201 days.

(21) Appl. No.: 18/288,053

(22) PCT Filed: May 2, 2022

(86) PCT No.: PCT/IB2022/054044
§ 371 (c)(1),
(2) Date: Oct. 24, 2023

(87) PCT Pub. No.: WO2022/234436
PCT Pub. Date: Nov. 10, 2022

(65) Prior Publication Data

US 2024/0204823 A1 Jun. 20, 2024

Related U.S. Application Data

(60) Provisional application No. 63/221,239, filed on Jul. 13, 2021, provisional application No. 63/184,090, filed on May 4, 2021.

(51) Int. Cl.
*H04B 3/54* (2006.01)
*B60R 16/023* (2006.01)
(Continued)

(52) U.S. Cl.
CPC ............ *H04B 3/54* (2013.01); *B60R 16/023* (2013.01); *B60R 16/03* (2013.01); *G01R 29/26* (2013.01);
(Continued)

(58) Field of Classification Search
CPC .... H04B 3/54; H04B 3/46; H04B 2203/5495; B60R 16/023; B60R 16/03; G01R 29/26;
(Continued)

(56) References Cited

U.S. PATENT DOCUMENTS

| | | | | |
|---|---|---|---|---|
| 10,050,674 | B1 * | 8/2018 | Hayes | H04B 3/542 |
| 2004/0119587 | A1 * | 6/2004 | Davenport | B61L 5/189 340/538 |

(Continued)

*Primary Examiner* — Daniel C Puentes
*Assistant Examiner* — Michael J Warmflash

(57) ABSTRACT

There are provided methods and systems for operating electric vehicles. One example method includes generating, at a first component of the electric vehicle, a message in a first communication protocol and converting, at a first conversion module associated with the first component, the message into a power line communication protocol to form a first converted message. The method also includes transmitting the first converted message over a power line connecting the first component to a second component of the electric vehicle, and converting, at a second conversion module associated with the second component, the first converted message into a second communication protocol to
(Continued)

form a second converted message. The second communication protocol is used by the second component. In addition, the method includes receiving the second converted message at the second component.

23 Claims, 10 Drawing Sheets

(51) Int. Cl.

| | |
|---|---|
| ***B60R 16/03*** | (2006.01) |
| ***G01R 29/26*** | (2006.01) |
| ***H04B 3/46*** | (2015.01) |
| ***H04L 12/40*** | (2006.01) |
| ***H04W 4/46*** | (2018.01) |

(52) U.S. Cl.
CPC ............... *H04B 3/46* (2013.01); *H04L 12/40* (2013.01); *H04W 4/46* (2018.02); *H04B 2203/5495* (2013.01); *H04L 2012/40215* (2013.01)

(58) Field of Classification Search
CPC ........... H04L 12/40; H04L 2012/40215; H04L 67/12; H04L 69/40; H04W 4/46
See application file for complete search history.

(56) References Cited

U.S. PATENT DOCUMENTS

| | | | | |
|---|---|---|---|---|
| 2010/0299466 | A1* | 11/2010 | Asano | H04L 12/40039 710/105 |
| 2012/0274278 | A1* | 11/2012 | Igata | B60L 53/60 320/109 |
| 2014/0177694 | A1* | 6/2014 | Alloin | H04B 3/46 375/227 |
| 2015/0222112 | A1* | 8/2015 | Wallace | H02H 1/0061 361/90 |
| 2015/0224890 | A1* | 8/2015 | Kim | H04L 12/40006 320/109 |
| 2016/0068073 | A1* | 3/2016 | Taylor | B60L 53/11 320/109 |
| 2018/0076850 | A1* | 3/2018 | Zhu | H04B 3/30 |
| 2018/0201147 | A1* | 7/2018 | Shin | B60L 53/62 |
| 2020/0099253 | A1* | 3/2020 | Mizutani | B60R 16/03 |
| 2020/0276908 | A1* | 9/2020 | Lim | B60L 53/14 |
| 2021/0152002 | A1* | 5/2021 | Sugino | H02J 7/825 |
| 2021/0203381 | A1* | 7/2021 | Zhang | H04B 3/54 |
| 2022/0352722 | A1* | 11/2022 | Narla | H02J 3/381 |
| 2023/0182612 | A1* | 6/2023 | Ballantyne | A01D 34/78 320/109 |
| 2024/0243774 | A1* | 7/2024 | Mankowski | H04B 3/46 |
| 2024/0305333 | A1* | 9/2024 | Plow | H04B 3/542 |

* cited by examiner

Generating, at a first component of an electric vehicle, a message in a first communication protocol

105

Converting, at a first conversion module associated with the first component, the message into a power line (PL) communication protocol to form a first converted message

110

Transmitting the first converted message over a power line connecting the first component to a second component of the electric vehicle

115

Converting, at a second conversion module associated with the second component, the first converted message into a second communication protocol to form a second converted message, the second communication protocol used by the second component

120

Receiving the second converted message at the second component

125

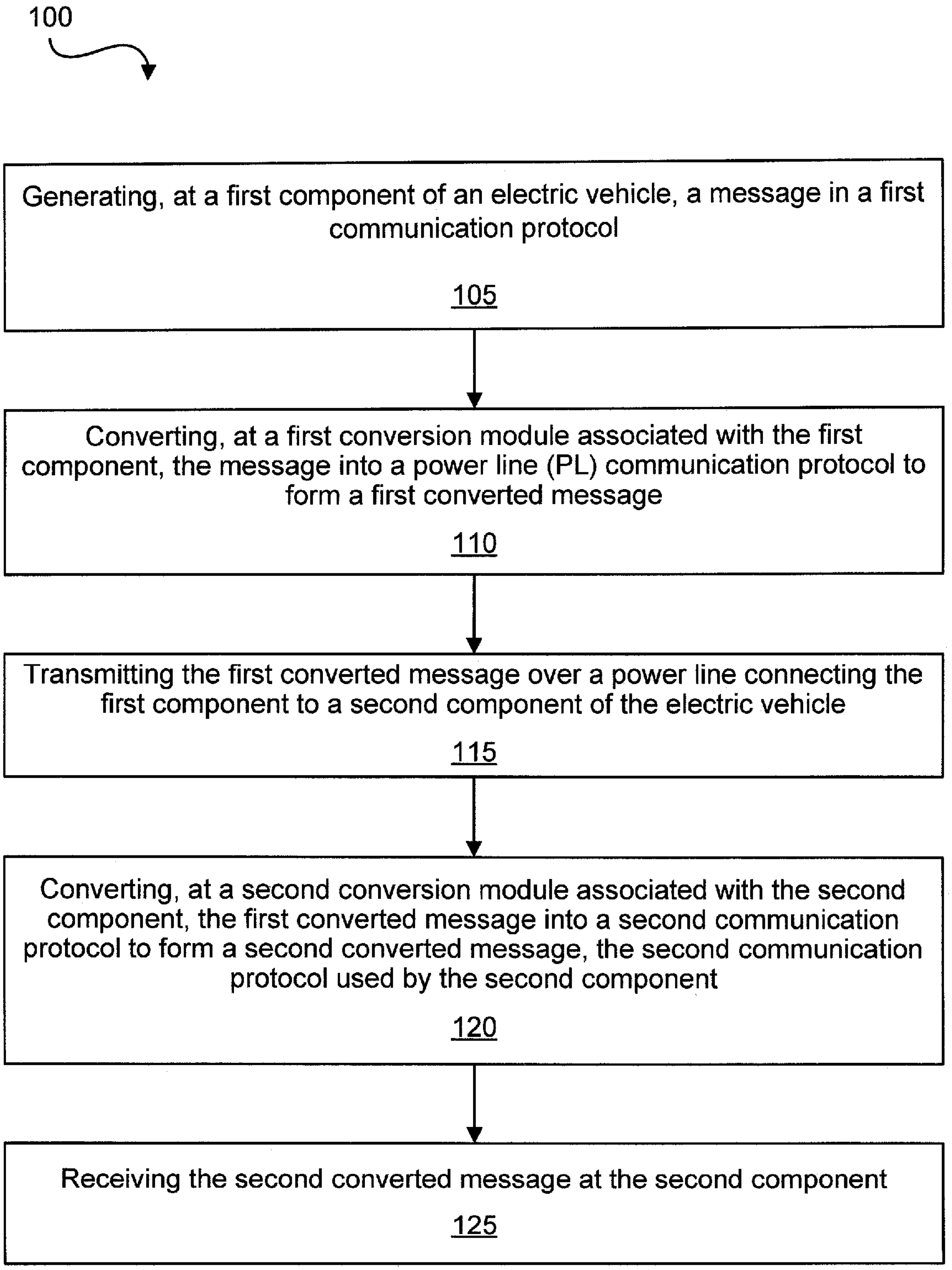

Fig. 1

METHODS AND SYSTEMS FOR OPERATING AN ELECTRIC VEHICLE

CROSS-REFERENCE TO RELATED APPLICATIONS

This application claims priority from U.S. Provisional Patent Application No. 63/184,090, filed on May 4, 2021, which is incorporated herein by reference in its entirety. This application also claims priority from U.S. Provisional Patent Application No. 63/221,239, filed on Jul. 13, 2021, which is incorporated herein by reference in its entirety.

FIELD

The present specification relates to methods and systems for operating an electrical device, and in particular to methods and systems for operating an electric vehicle.

BACKGROUND

Some vehicles may be powered by electricity and use electric motors for actuation. Such electric vehicles may have a variety of components. These components may communicate with each other to allow the components to work together to operate the electric vehicle.

SUMMARY

According to an implementation of the present specification there is provided a method of operating an electric vehicle, the method comprising: generating, at a first component of the electric vehicle, a message in a first communication protocol; converting, at a first conversion module associated with the first component, the message into a power line (PL) communication protocol to form a first converted message; transmitting the first converted message over a power line connecting the first component to a second component of the electric vehicle; converting, at a second conversion module associated with the second component, the first converted message into a second communication protocol to form a second converted message, the second communication protocol used by the second component; and receiving the second converted message at the second component.

The power line may comprise a first wire and a second wire, the first wire and the second wire each being a physical wire; and the transmitting the first converted message over the power line may comprise transmitting the first converted message over one or more of the first wire and the second wire.

The power line may consist of the first wire and the second wire; and the transmitting the first converted message over the power line may comprise transmitting the first converted message over one or more of the first wire and the second wire.

The first wire may be to carry electrical power and the second wire may be to function as ground.

The first communication protocol may be the same as the second communication protocol; and the second converted message may be the same as the message.

One or more of the first communication protocol and the second communication protocol may comprise a Controller Area Network (CAN) protocol.

The method may further comprise: determining, at a power line sensing module in communication with the power line, a noise region of noise associated with the power line, the noise region comprising one or more of: a frequency of the noise, an amplitude of the noise, and a change of a noise attribute of the noise over time.

The method may further comprise: changing a message attribute of one or more of the message, the first converted message, and the second converted message to avoid the noise region.

The message attribute may comprise a carrier frequency; and the changing the message attribute may comprise changing the carrier frequency.

The method may further comprise: providing electrical power via the power line to one or more of the first component and the second component.

According to another implementation of the present specification there is provided a system for operating an electric vehicle, the system comprising: a first component of the electric vehicle, the first component to generate a message in a first communication protocol; a first conversion module associated with the first component, the first conversion module to convert the message into a power line (PL) communication protocol to form a first converted message; a power line connecting the first component to a second component of the electric vehicle, the power line to transmit the first converted message; and a second conversion module associated with the second component, the second conversion module to convert the first converted message into a second communication protocol to form a second converted message, the second communication protocol used by the second component; wherein the second component is to receive the second converted message.

The power line may comprise a first wire and a second wire, the first wire and the second wire each being a physical wire.

The power line may consist of the first wire and the second wire.

The first wire may be to carry electrical power and the second wire may be to function as ground.

The first communication protocol may be the same as the second communication protocol; and the second converted message may be the same as the message.

One or more of the first communication protocol and the second communication protocol comprise a Controller Area Network (CAN) protocol.

The system may further comprise: a power line sensing module in communication with the power line, the power line sensing module to determine a noise region of noise associated with the power line, the noise region comprising one or more of: a frequency of the noise, an amplitude of the noise, and a change of a noise attribute of the noise over time.

The power line sensing module may be further to direct a change in a message attribute of one or more of the message, the first converted message, and the second converted message to avoid the noise region.

The message attribute may comprise a carrier frequency.

One of the first component and the second component may comprise a first subnet having a first BUS and one or more corresponding components connected to the first BUS; and the other one of the first component and the second component may comprise a second subnet having a second BUS and one or more corresponding components connected to the second BUS.

The first subnet may be associated with an electric motor of the electric vehicle; and the second subnet may be associated with one or more peripherals of the electric vehicle.

The noise may originate from the first subnet; and the power line sensing module may be further to direct a change in a message attribute of one or more of the message, the first converted message, and the second converted message to avoid the noise region.

One or more of the first component and the second component may be to receive electrical power via the power line.

BRIEF DESCRIPTION OF THE DRAWINGS

Some example implementations of the present specification will now be described with reference to the attached Figures, wherein:

FIG. 1 shows a flowchart of an example method of operating an electric vehicle, in accordance with a non-limiting implementation of the present specification.

DETAILED DESCRIPTION

Figure 2:
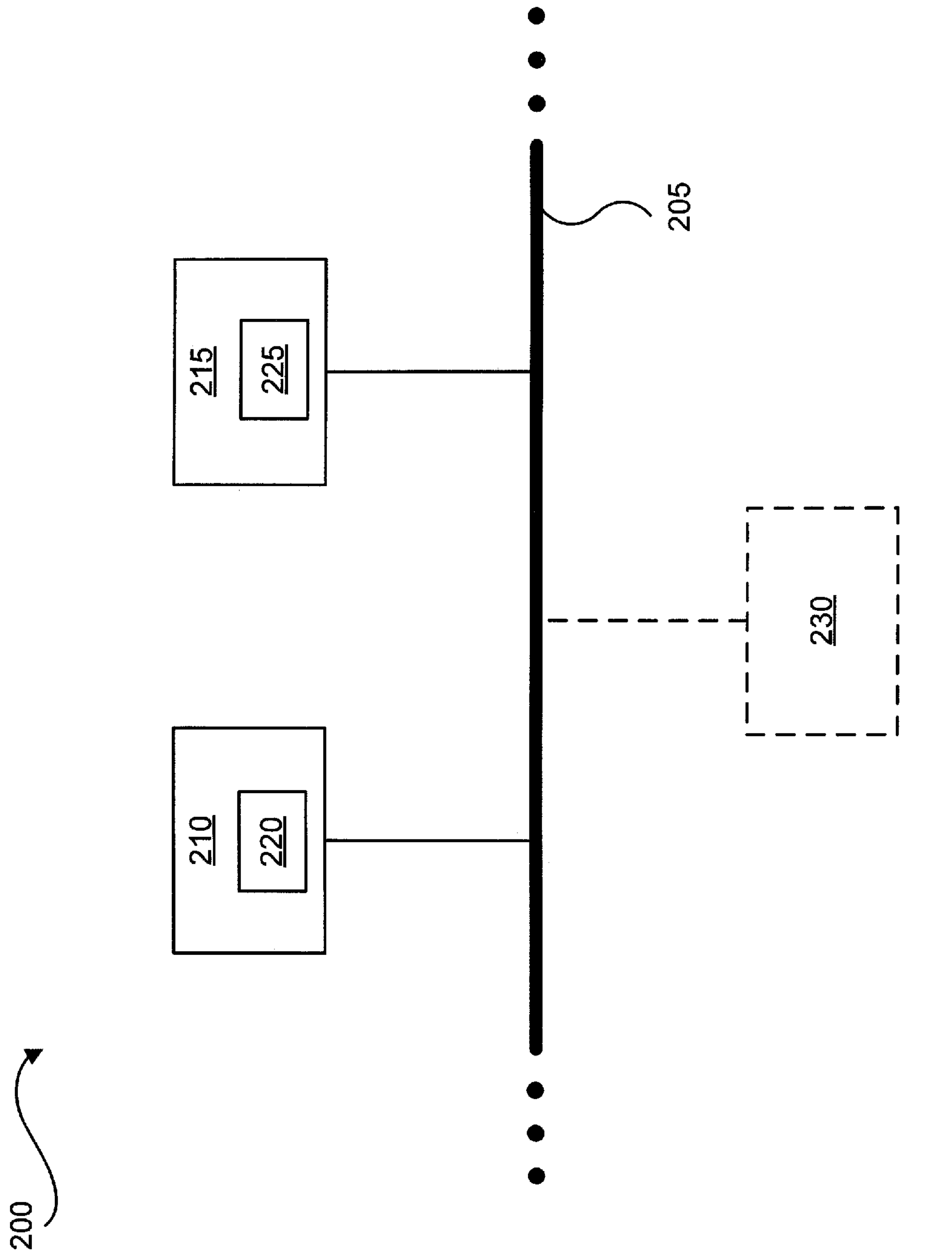
FIG. 2 shows a schematic representation of an example system for operating an electric vehicle, in accordance with a non-limiting implementation of the present specification.

Unless the context requires otherwise, throughout this specification the word "comprise" and variations thereof, such as, "comprises" and "comprising" are to be construed in an open, inclusive sense, that is as "including, but not limited to."

As used in this specification, the singular forms "a," "an," and "the" include plural referents unless the content clearly dictates otherwise. It should also be noted that the term "or" is generally employed in its broadest sense, that is as meaning "and/or" unless the content clearly dictates otherwise.

Communication between the components of an electric vehicle may include high power signals and low power signals. High power signals may be used, for example, to conduct power from a battery to an electric motor to power the electric motor. In some examples, low power signals may comprise control or communication signals, for example from an operator to the electric vehicle, between the components of the electric vehicle, and from the electric vehicle to the operator or another entity outside the vehicle.

High power signals may be conducted over a power line (PL). In some examples, such a power line may form, or be part of, a BUS, a communication backbone, a communication network, or the like in the electric vehicle. In some electric vehicles, the low power signals may be communicated over a separate low power network. Examples of such a lower power network may include a Controller Area Network (CAN), and the like. The use of different types of physical BUSes or networks in an electric vehicle may make wiring in such vehicles more complicated and expensive.

To reduce the cost and complexity of wiring, the power line may be used to conduct or communicate both high power and low power signals. FIG. 1 shows a flowchart of an example method 100 for operating an electric vehicle, whereby a message generated by a first component of the electric vehicle may be converted and communicated via the power line to a second component of the electric vehicle.

At box 105 of method 100, a first component of the electric vehicle may generate a message in a first communication protocol. In some examples, the electric vehicle may comprise a lawn mower, a golf cart, a passenger car, and the like. The component of the electric vehicle may comprise a component that sends or receives power, or other messages, to or from other components of the electric vehicle or to or from entities outside of the vehicle. Examples of such components may include batteries, actuators, vehicle control module (VCM), controllers, sensors, input and output terminals, peripherals, and the like. The connections and interactions between the vehicle components and the power line are described in greater detail in relation to FIGS. 2-10.

Communication protocol may refer to the format of the message. For example, communication protocol may specify the attributes or parameters for communicating, such as the structure or format of the one or more data packets that comprise the first message, and the like. The message generated by the first component may be a low power signal or message. In some examples, the first communication protocol may comprise Controller Area Network (CAN) protocol. It is also contemplated that in some examples, the first communication protocol may comprise other protocols such as Universal Asynchronous Receiver-Transmitter (UART), Inter-Integrated Circuit ($I^2C$), RS-2xx, RS-4xx, Ethernet, and the like.

At box 110, the first message may be converted into a power line (PL) communication protocol to form a first converted message. This conversion may be performed by a first conversion module associated with the first component. In some examples, the first conversion module may be a component of the electric vehicle outside of the first component. It is also contemplated that in some examples, the first conversion module may comprise a functional or physical module within the first component. Moreover, in some examples, the first conversion module may be a physical or functional module incorporated into another component of the electric vehicle. The modes of association between the components of the electric vehicle and their associated conversion modules are described in greater detail in relation to FIGS. 2 and 3.

The PL communication protocol may comprise a communication protocol that allows messages to be sent over the power line. In some examples, these messages may comprise low power messages. Moreover, in some examples where the first communication protocol is the CAN protocol and the message is to be converted to the power line (PL) communication protocol, a DCAN500 chip made by Yamar™ may be used to convert messages between CAN and PL protocols.

Turning now to box 115 of method 100, the first converted message may be transmitted over a power line connecting the first component to the second component of the electric vehicle. Transmitting the converted message over the power line may also be described as transmitting the converted message via, through, or using the power line. The power line may comprise a conductor capable of conducting both high power and low power signals in the electric vehicle. In some examples, the power line may comprise a first wire and a second wire. Both wires may be physical wires. Moreover, in some examples one of the wires may carry electrical power and the other wire may function as ground. The power wire may also be referred to as Common Collector Voltage (VCC) and the ground wire may be designated as GND. Transmitting the first converted message over the power line may comprise transmitting the converted message over one or more of the first wire and the second wire of the power line.

In order to further simplify the wiring of the electric vehicle, in some examples the power line may comprise only the power and ground wires. In other words, in such examples the power line may consist of power and ground wires. It is also contemplated that in some examples, the power line may comprise electrical conductors or wires in addition to the power and ground wires.

Figure 3:
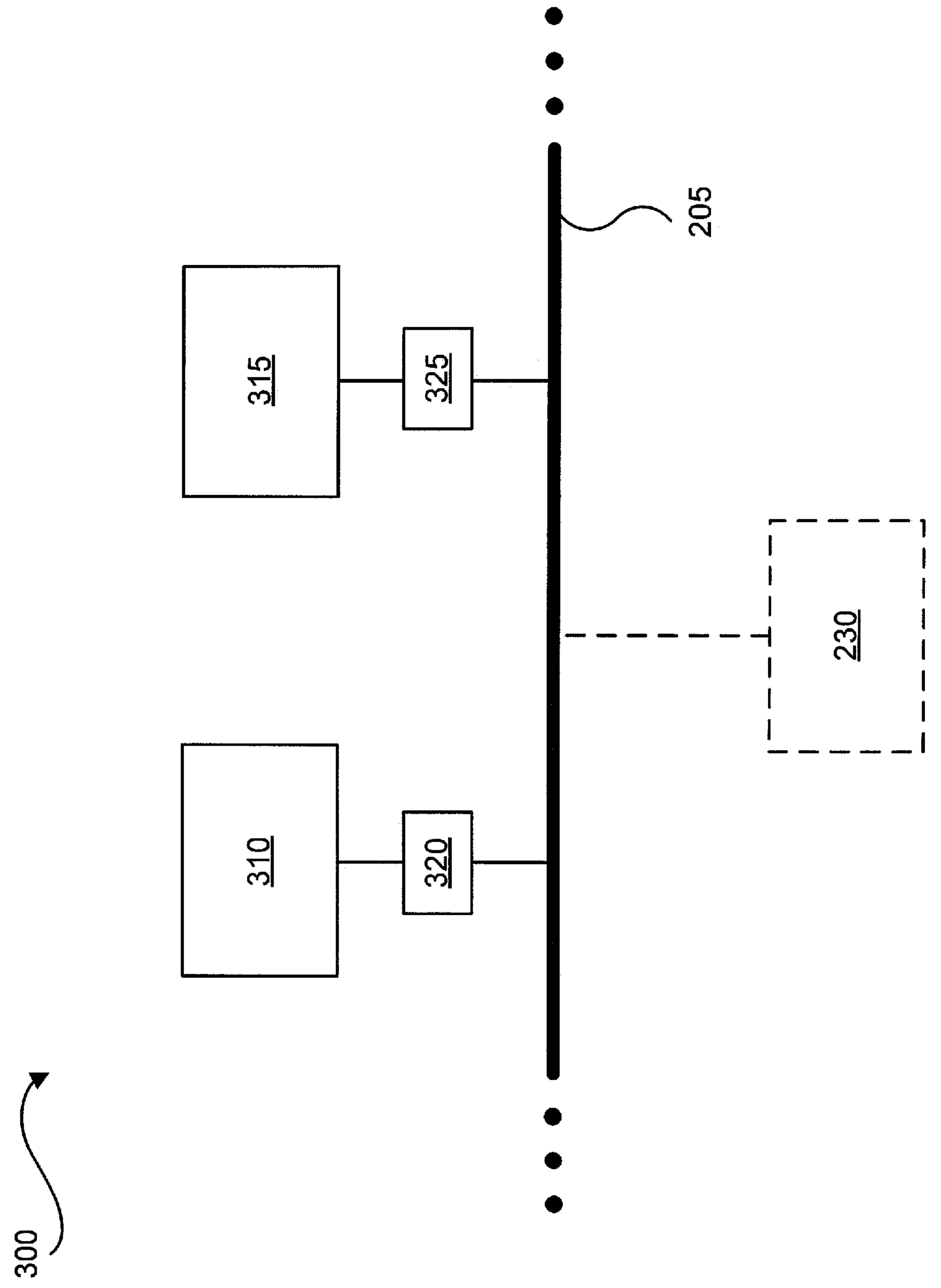
FIG. 3 shows a schematic representation of another example system for operating an electric vehicle, in accordance with a non-limiting implementation of the present specification.

The second component may be a component outside of the first component and connected to the first component by the power line. In some examples, the second component may comprise a battery, actuator, vehicle control module (VCM), controller, sensor, input or output terminal, peripheral, and the like. The connection of the first and second components to the power line may be direct or indirect. For example, where the conversion module is a functional or physical component within a given component of the electric vehicle, that given component may be connected directly to the power line. An example of this arrangement is shown in FIG. 2. Similarly, where the conversion module is separate from its associated component of the electric vehicle, the given component may be connected to the power line indirectly via its associated conversion module. An example of this arrangement is shown in FIG. 3. The description in box 115 is intended to cover both direct and indirect connections of the first and second components to the power line.

Furthermore, in some examples, the first converted message in the PL communication protocol may be specifically addressed or directed to the second component. In addition, in some examples, the first converted message may be broadcast over the power line for one or more other components, including the second component, to receive.

At box 120 of method 100, the first converted message may be converted into a second communication protocol to form a second converted message. The second communication protocol may be used by the second component. This conversion may be performed by a second conversion module associated with the second component. In other words, the second conversion module may receive the first converted message from the power line and convert it into a second communication protocol used or accepted by the second component. In some examples, in structure, function, and its association with its respective component, the second conversion module may be similar to the first conversion module.

In some examples where the second communication protocol is the CAN protocol and the first converted message is to be converted from the PL communication protocol to CAN protocol, a DCAN500 chip made by Yamar™ may be used to convert messages between CAN and PL protocols.

At box 125 the second converted message may be received by the second component of the electric vehicle. In some examples, the first and second communication protocols may be the same. In such examples, the first and second converted messages may be the same. In other words, the first conversion module converts the message from the first communication protocol into the PL communication protocol, and the second conversion module converts that message back from the PL communication protocol into the first communication protocol to recover the original message in its original communication protocol. Such an arrangement may be used if both the first and second components of the electric vehicle use the same communication protocol. In some examples, one or both the first and second components may use the CAN protocol.

Since the first and second components are connected to the power line, electrical power may also be provided via the power line to one or both of the first and second components. Method 100 and the other methods described herein allow the components of an electric vehicle, including those components that do not use the PL communication protocol, to send and receive both low power communication signals and high power signals over the power line. This, in turn, may reduce the complexity and cost of the wiring used to connect the various components of the electric vehicle.

While method 100 refers to first and second components of the electric vehicle being connected to and communicating via the power line, it is also contemplated that in some examples three or more components may be connected to and communicating via the power line. Moreover, in some examples, one or more of the components connected to the power line need not be a single component and may comprise a subnet of other components, as will be described in greater detail in relation to FIG. 4.

In some situations, noise or interference may impact messages with certain attributes communicated over the power line. Such noise or interference may be caused by components or loads connected to the power line such as electric motors, and the like. In addition, noise or interference may be caused by sources not connected to the power line, such as other components of the electric vehicle or by sources outside of the electric vehicle. In some examples, this noise or interference may be detected, and the attributes of messages modified to avoid the noise or to reduce the impacts of the noise on the transmission of messages over the power line. In the following description, "noise" may be used to refer inclusively to both noise and interference caused by sources that may or may not be connected to the power line.

In order to address possible noise on the power line, in some examples method 100 may further comprise determining a noise region of noise associated with the power line. This determination may be made by a power line sensing module in communication with the power line. The power line sensing module may be in direct or indirect communication with the power line. In some examples, the power line sensing module may comprise a stand-alone component connected to the power line. Moreover, in some examples, the power line sensing module may comprise a functional or physical module incorporated into another component connected to the power line. For example, the power line sensing module may be incorporated into the VCM, first or second conversion modules, and the like.

In some examples, the power line sensing module may be or comprise an Artificial Intelligence Noise Pattern Scanner (AINPS) system. Such an AINPS system may have the following features and perform the following functions: a frequency sweep of all spectrum bandwidth used for communication; flagging those areas with suspected interruptions or noise which may comprise radio frequency (RF), alternating current (AC), or direct current (DC); and generating an artificial intelligence (AI)-based signal in a corresponding spectrum region to reduce, attenuate, or otherwise combat the noise. In some examples, this generation of an AI-based signal for combatting the noise may be similar to the audio echo cancellation for recording studios. Example AINPS systems are described in greater detail in U.S. Provisional Patent Application No. 63/221,239, filed on Jul. 13, 2021, which is incorporated herein by reference in its entirety.

The noise region may comprise one or more of: a frequency of the noise, an amplitude of the noise, and a change of a noise attribute of the noise over time. Example attributes of the noise may include amplitude, frequency, and the like. In some examples, the power line sensing module may track or log the noise regions on the power line. In addition, in some examples, method 100 may further comprise changing one or more message attributes of one or more of the message, the first converted message, and the second converted message to avoid the noise region. In some examples, the message attribute being changed may comprise the carrier frequency. Moreover, in some examples, the message attribute may comprise a modulation of the message. In other words, in some examples, one or more of the carrier frequency and the modulation of the message may be changed to avoid the noise region.

Moreover, in some examples, a predetermined list of carrier frequencies may be maintained. If the original carrier frequency is affected by noise, substitute frequencies from the predetermined list may be tried sequentially until a substitute frequency is found that is less affected, or not affected, by the noise. This process may be referred to as frequency hopping. It is also contemplated that in some examples, instead of or in addition to using a predetermined list of substitute frequencies, the frequency hopping may be adaptive and tailored to the characteristics of the noise present on the power line.

In some examples, the frequency hopping is directed by the power line sensing module. It is also contemplated that in some examples, the frequency hopping may be performed or directed by another functional or physical module of the components of the electric vehicle connected to the power line. In some such examples, the frequency hopping may be performed by a functional or physical module within the VCM, the conversion modules, and the like.

In addition, in some examples, the power line may allow for bi-directional exchange of messages between the first and second components. This functionality may be made possible, for example, be designating different frequencies for send and receive directions. By reducing or eliminating frequency overlap between send and receive messages and directions, the power line may be able to transmit messages in both send and receive direction simultaneously without the send and receive messages interfering with one another.

Turning now to FIG. 2, a schematic representation is shown of an example system 200 for operating an electric vehicle. System 200 comprises a power line 205 connecting a first component 210 of the electric vehicle to a second component 215 of the electric vehicle. Power line 205, first component 210, and second component 215 may be similar in structure and function to the corresponding power line and first and second components described in relation to method 100 and the other methods described herein. The ellipsis or three dots at the ends of power line 205 are intended to indicate that power line 205 may be longer than depicted, and may have additional components attached to it.

First component 210 may generate a message in a first communication protocol. System 200 also comprises first conversion module 220 associated with first component 210. In system 200, conversion module 220 is a functional or physical module within first component 210. It is also contemplated that in some examples, the conversion module may have a different association or relationship with its corresponding first component. An example of such a different association is described in greater detail in relation to FIG. 3.

First conversion module 220 may convert the message into a power line (PL) communication protocol to form a first converted message. Power line 205 may transmit the first converted message to second component 215. System 200 may also comprise a second conversion module 225 associated with second component 215. Second conversion module 225 may convert the first converted message into a second communication protocol to form a second converted message. The second communication protocol may be used by second component 215. Second component 215 may receive and use the second converted message.

In system 200, conversion module 225 is a functional or physical module within second component 215. It is also contemplated that in some examples, the conversion module may have a different association or relationship with its corresponding second component. An example of such a different association is described in greater detail in relation to FIG. 3. In some examples where the first and second communication protocols are both the CAN protocol, one or both of first conversion module 220 and second conversion module 225 may comprise a DCAN500 chip made by Yamar™ for converting between PL communication protocol and CAN protocol messages.

In some examples, power line 205 may comprise a first wire and a second wire. Both wires may be physical wires. Moreover, in some examples one of the wires may carry electrical power and the other wire may function as ground. The power wire may also be referred to as Common Collector Voltage (VCC) and the ground wire may be designated as GND.

In order to further simplify the wiring of the electric vehicle, in some examples the power line may comprise only the power and ground wires. In other words, in such examples the power line may consist of power and ground wires. It is also contemplated that in some examples, the power line may comprise electrical conductors or wires in addition to the power and ground wires.

Furthermore, in some examples, the first communication protocol may be the same as the second communication protocol. In such examples, the second converted message may be the same as the original message. In other words, if the first and second components use the same communication protocol, the second conversion module may convert the first converted message back into the communication protocol used by both components thereby converting the first converted message back into its original communication protocol. As described above, in some examples one or more of the first communication protocol and the second communication protocol may comprise the CAN protocol.

Moreover, in some examples, one or more of components 210 and 215 may also receive electrical power via power line 205. In some examples, this electrical power may be delivered via high power signals. In examples where one of the components is an electric motor, the motor may receive over the power line both high power signals from the battery and low power control signals from a VCM of the electric vehicle.

System 200 may also comprise a power line sensing module 230 in communication with power line 205. The functions and implementation of power line sensing module 230 may be similar to functions and implementation of the corresponding power line sensing module described in relation to method 100 and the other methods described herein. Module 230 may determine a noise region of noise associated with power line 205. For example, module 230 may scan different frequency ranges on power line 205 to detect possible regions or frequencies of noise on power line 205. This function of searching for and detecting noise may also be described as noise sniffing. In some examples, the noise region may comprise one or more of: a frequency of the noise, an amplitude of the noise, and a change of a noise attribute of the noise over time.

In some examples, power line sensing module 230 may be or comprise an Artificial Intelligence Noise Pattern Scanner (AINPS) system. Such an AINPS system may have the following features and perform the following functions: a frequency sweep of all spectrum bandwidth used for communication; flagging those areas with suspected interruptions or noise which may comprise radio frequency (RF), alternating current (AC), or direct current (DC); and generating an artificial intelligence (AI)-based signal in a corresponding spectrum region to reduce, attenuate, or otherwise combat the noise. In some examples, this generation of an AI-based signal for combatting the noise may be similar to the audio echo cancellation for recording studios. Example AINPS systems are described in greater detail in U.S. Provisional Patent Application No. 63/221,239, filed on Jul. 13, 2021, which is incorporated herein by reference in its entirety.

In some examples, module 230 may direct a change in a message attribute of one or more of the message, the first converted message, and the second converted message to avoid the noise region. Moreover, in some examples, the message attribute may comprise a carrier frequency. In some such examples, module 230 may direct or implement frequency hopping, which may be based on a predetermined list of substitute frequencies. The frequency hopping may also be adaptive based on the characteristics of the noise.

In FIG. 2, module 230 is depicted in dashed lines to indicate that in some examples system 200 need not comprise a free-standing or separate module 230. In some such examples, the functionality of module 230 may be incorporated into another component connected to power line 205, such as VCM and the like. It is also contemplated that in some examples, system 200 need not comprise the functionality of module 230.

Turning now to FIG. 3, a schematic representation is shown of an example system 300 for operating an electric vehicle. System 300 may be similar to system 200, with a difference being that in system 300 the conversion modules are separate or outside of their corresponding components of the electric vehicle. System 300 comprises first and second components 310 and 315 having associated first and second conversion modules 320 and 325 respectively. Conversion modules 320 and 325 may be similar in function to conversion modules 220 and 225.

Components 310 and 315 may also be similar to components 210 and 215, with a difference being that components 310 and 315 have their associated conversion module external to components 310 and 315. In addition, as shown in FIG. 3, components 310 and 315 are connected to power line 205 via conversion modules 320 and 325 respectively. As such, components 310 and 315 are connected indirectly to power line 205.

Figure 4:
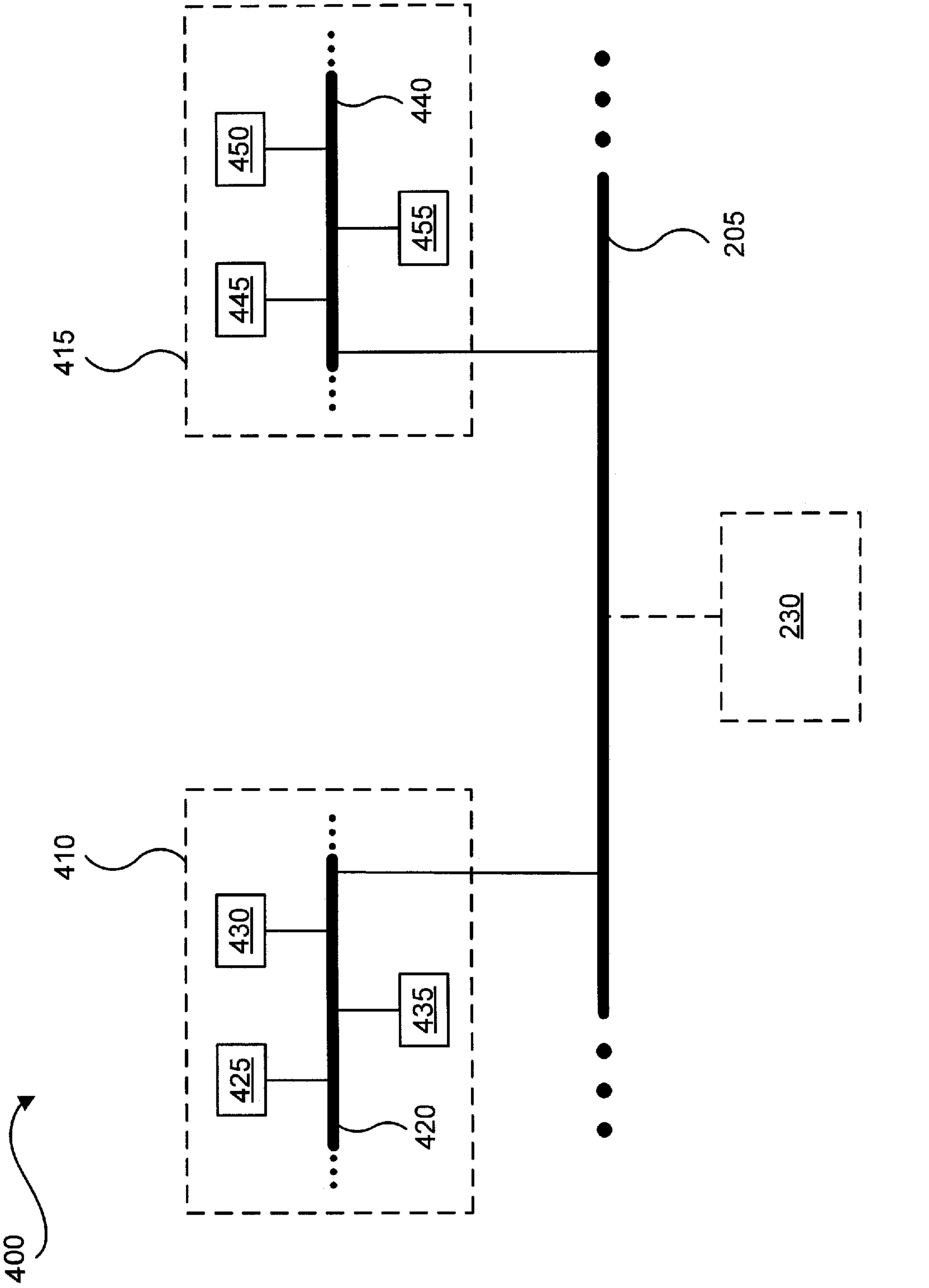
FIG. 4 shows a schematic representation of yet another example system for operating an electric vehicle, in accordance with a non-limiting implementation of the present specification.

FIG. 4, in turn, shows a schematic representation of an example system 400 for operating an electric vehicle. System 400 may be similar to system 200, with a difference being that in system 200 components 410 and 415 connected to power line 205 each comprise a subnet with its own BUS or communication backbone and connected components. For example, component 410 comprises a BUS 420 and components 425, 430, and 435 connected to BUS 420. BUS 420 may be a power line BUS, a CAN BUS, or another type of BUS. A power line BUS may also be referred to simply as a power line. Similarly, component 415 comprises a BUS 440 and components 445, 450, and 455 connected to BUS 440. BUS 440 may be a power line BUS, a CAN BUS, or another type of BUS.

Power line 205 connects components 410 and 415 by connecting BUS 420 to BUS 440. While not shown in FIG. 4, it is contemplated that in examples where BUSes 420 and 440 use different communication protocols than power line 205, conversion modules may be disposed between power line 205 and each of BUSes 420 and 440 to allow the signals and messages to be converted to the appropriate communication protocol for each conductor or communication backbone over which they are to be transmitted.

In addition, while FIG. 4 shows two subnets connected to power line 205, it is contemplated that in some examples three or more subnets may be connected to power line 205. It is also contemplated that in some examples, a mix of one or more individual components and one or more subnets may be connected to power line 205. Moreover, while FIG. 4 shows each subnet as having three components connected to its corresponding BUS, it is contemplated that in some examples, each subnet may have one, two, or more than three components connected to its corresponding BUS.

In some examples, a first one of the subnets may be associated with an electric motor of the electric vehicle. Some example components that may be part of this subnet may include one or more electric motors, motor controllers, and the like. A second one of the subnets may be associated with some or all of the peripherals of the electric vehicle. Examples of such peripherals may include sensors, input and output terminals, cabin comfort components, and the like.

In operation, the one or more electric motors or other components of the first subnet may generate noise that may affect the power line. To reduce adverse effects of this noise on the operation of other components connected to the power line, such as the components of the second subnet, power line sensing module 230 may direct a change in a message attribute of one or more of the message, the first converted message, and the second converted message to avoid the noise region of the noise originating from the first subnet. Examples of such a message attribute may include carrier frequency, modulation, and the like.

Figure 5:
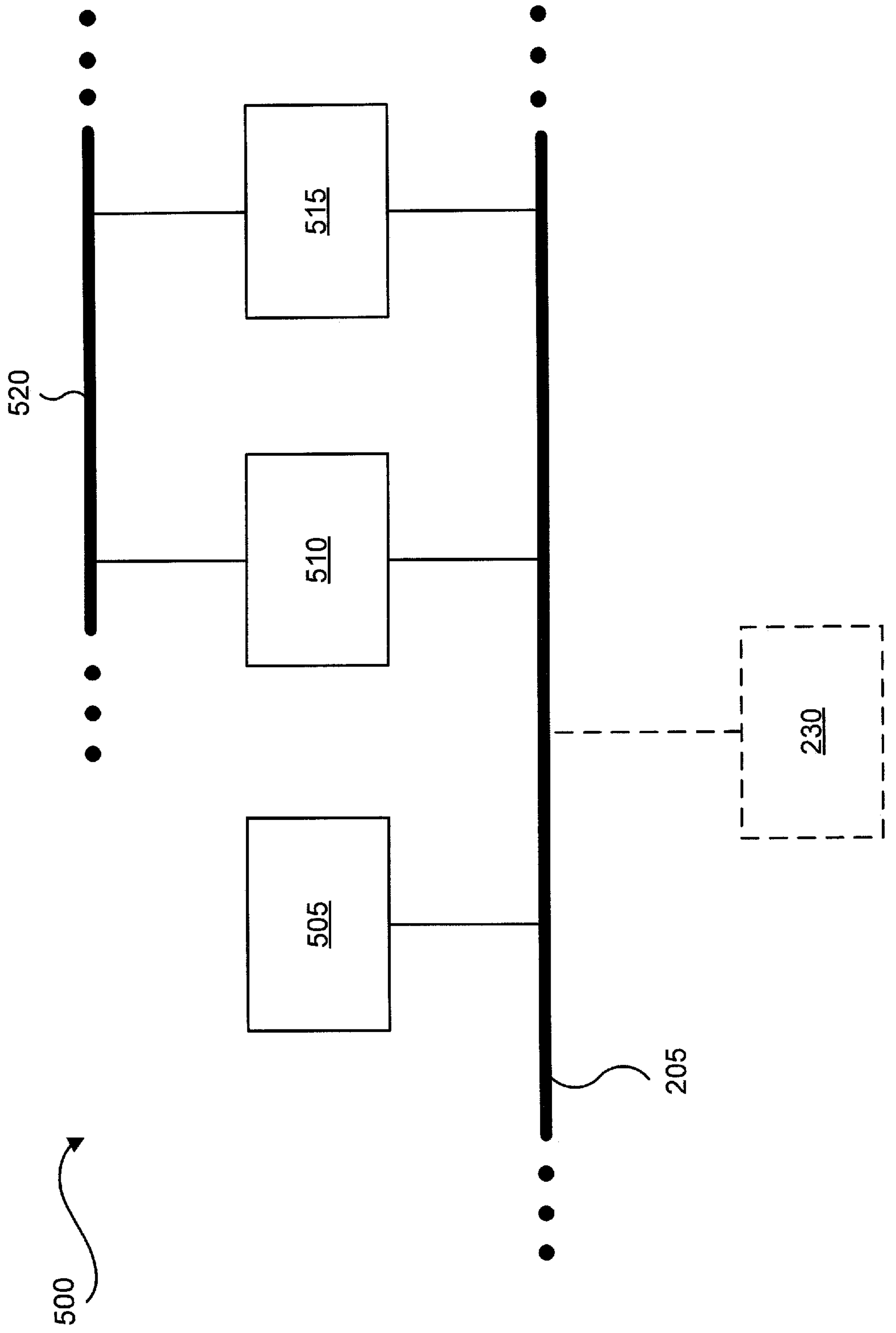
FIG. 5 shows a schematic representation of yet another example system for operating an electric vehicle, in accordance with a non-limiting implementation of the present specification.

Turning now to FIG. 5, a schematic representation is shown of an example system 500 for operating an electric vehicle. System 500 may be similar to system 200 in terms of system 500 having a number of components 505, 510, and 515 of the electric vehicle connected to power line 205. In system 500, components 510 and 515 are also connected together by a second communication backbone, namely by BUS 520. BUS 520 may comprise a power line BUS, a CAN BUS, or another type of BUS.

In system 500, BUS 520 provides an alternate or backup to power line 205 for components 510 and 515 to communicate with one another. In some examples, the ability of components 510 and 515 to communicate may be important to the correct and safe functioning and operation of the electric vehicle. For example, components 510 and 515 may comprise an electric motor and its corresponding controller or VCM. In some such examples, allowing components 510 and 515 to communicate over both power line 205 and BUS 520 may increase the reliability and safety of the electric vehicle.

Moreover, in some examples, the communication between components 510 and 515 may be particularly sensitive to noise. If there is excessive noise present on power line 205, BUS 520 may provide a less noisy channel for communications between components 510 and 515. While FIG. 5 shows components 510 and 515 being connected to one another by both power line 205 and BUS 520, it is contemplated that in some examples, components 510 and 515 need not be connected by power line 205. In these examples, components 505 and 510 may be connected together by power line 205 and components 510 and 515 may be connected together by BUS 520.

In addition, while FIG. 5 shows three components 505, 510, and 515 being connected to power line 205, and two of those components being connected also to BUS 520, it is contemplated that in some examples more or fewer components may be connected to each of power line 205 and BUS 520, in configurations that may be similar to or different from the configuration shown in FIG. 5. Moreover, in some examples, system 500 may comprise one or more additional BUSes, to which one or more of the components of the electric vehicle may be connected.

In some examples, the methods and systems described herein may be used as part of a control system for an electric vehicle, such as a lawn tractor, other lawn maintenance vehicles, and the like. Moreover, in some examples, such systems may comprise a power line-based communication network, a vehicle controller such as a VCM, multiple electric transaxles controlled by respective vehicle controllers, and one or more drive and steering input devices connected to corresponding sensors to sense an operator's drive, brake, and steering inputs. The controller may be able to interact with one or more of the vehicle's components via a power line communication protocol. Such power line-based communication and control methods and systems may also be referred to as Power Line Network Architecture (PLNA) or as PLNA-based methods and systems.

In some examples, a PLNA may provide noise sensing, noise region, statistics, alarms and "anticipated noise regions" based on a machine learning toolbox in both frequency and direct current (DC) vertical offset.

Moreover, in some examples, the controller may sense an operator's drive inputs, such as steering and braking, and translate those inputs into a power line communication protocol to transmit those inputs on a power line network to obtain, monitor, and adjust the speed and direction of the electric vehicle corresponding to the operator's control inputs. Drive controllers may convert digital, analogue, or both types of signals into a power line communication protocol in order to distribute them over the entire vehicle's network. Such a distribution over the vehicle network may be used to drive transaxles to obtain desired motion, speed, acceleration, and braking in accordance with an operator's input to the electric vehicle.

In some examples, the methods and systems described herein may be used for maintaining and controlling an electric vehicle and its drive, motion, battery, and the like through a power line network, PLNA. The steering and the drive inputs may be coupled with the vehicle controller digitally to report on the vehicle's performance and status via PLNA. Messages transmitted over the PLNA may allow for a full duplex (RX/TX) transmitted as data packets on power lines, which power lines may comprise GND and VCC conductors. In some examples, the level of voltage accepted by PLNA may be dynamically sensed and fed back to the vehicle's controller.

Furthermore, in some examples, an electronics drive module may detect and interpret the drive input messages posted on the PLNA Bus (i.e. the power line), compute and output control a signal based on the drive output message, as well as the status, direction, speed, inertia, acceleration, and braking of drive output devices. The drive module may then provide a drive output signal to the drive system using power line communication protocol data packets.

In some examples, the methods and systems described herein may include a functionality of sensing and sharing the properties of a power line environment, its noise distribution, voltage drifts, and statistics through a power line network, PLNA. The steering and the drive inputs may be coupled with the rest of the system via PLNA physical (PHY) network layer.

In addition, in some examples, the PLNA network topology may be based on "Ad Hoc Self Assembly". In some examples of such self-assembly, the vehicle network may be arranged or configured to contain no single point of failure, with the network connecting as many nodes or components to as many other parts of the system.

Moreover, in some examples the PLNA and its associated PL communication protocol may allow for the power line to be used for implementing a full-duplex, bi-directional communication scheme with payload, security, and frequency parameters capable of being used for power transmission and administrative tasks of the electric vehicle.

Furthermore, in some examples, the PLNA may be capable of porting a variety of "wired" communication protocols over it. Examples of such protocols may include CAN, Universal Asynchronous Receiver-Transmitter (UART), Inter-Integrated Circuit ($I^2C$), RS-2xx, RS-4xx, Ethernet, and the like.

In some examples, identification of noise regions may be implemented by searching for noise regions in one or more of frequency domain and the vertical GND-to-VCC direction. The resulting 2D model capabilities may allow for improved noise detection and avoidance. The power line sensing module may perform these functions. In some examples, this module may also be referred to as a Power Line Noise Sensing Module (PLNSM). Moreover, in some examples, the PLNSM may also perform the following functions: sensing and identifying regions with excessive noise, broadcasting a safe region to use for transmission, and the like.

In addition, in some examples, frequency hopping may be controlled by collective information gathering by the components connected to the power line. This in turn may reduce or obviate the need for a "master" component to coordinate the frequency hopping on the power line network.

Some systems and methods described herein may allow for reading an operator's controls and translating them into a digitized data. Such digital data may be formatted or packaged as data packets for transmission over the PLNA Bus, i.e. over the power line. For example, expected vehicle turn, acceleration, or rate of braking profile may be transmitted and shared with other components' digital data packets, formatted in the PL communication protocol, and transmitted over the power line.

In some examples, the methods and systems described herein may incorporate the functionality of allowing for communication among two or multiple components over the power line (e.g. GND and POWER wires) as a full duplex exchange of configurable data packets. Various types of items or components may be connected to the power line for communication and exchanging information with or without being directly connected to one another. Such use of a power line may simplify an electric vehicle's electrical harness, and the number of connections and the corresponding connectors. In addition, the transmission of PL communication protocol data packets over GND and VCC may allow for additional flexibility in components' placement in electric vehicles. Furthermore, in some examples, the systems and methods described herein may allow for sensing a vehicle operator's controls such as control inputs related to direction, turning, acceleration, braking, and the like.

In some examples, the vehicle drive and various controllers described herein may be capable of sensing an operator's steering and speed inputs from a pair of lap bars, without any additional wiring other than two power line wires (PWR and GND). Furthermore, in some examples, a physical motion of the vehicle control inputs may not be necessary. Operator's body parts pressure, gestures in the air, or voice commands may be detected and interpreted as valid for sharing with the rest of the components connected to the power line network.

Figure 6:
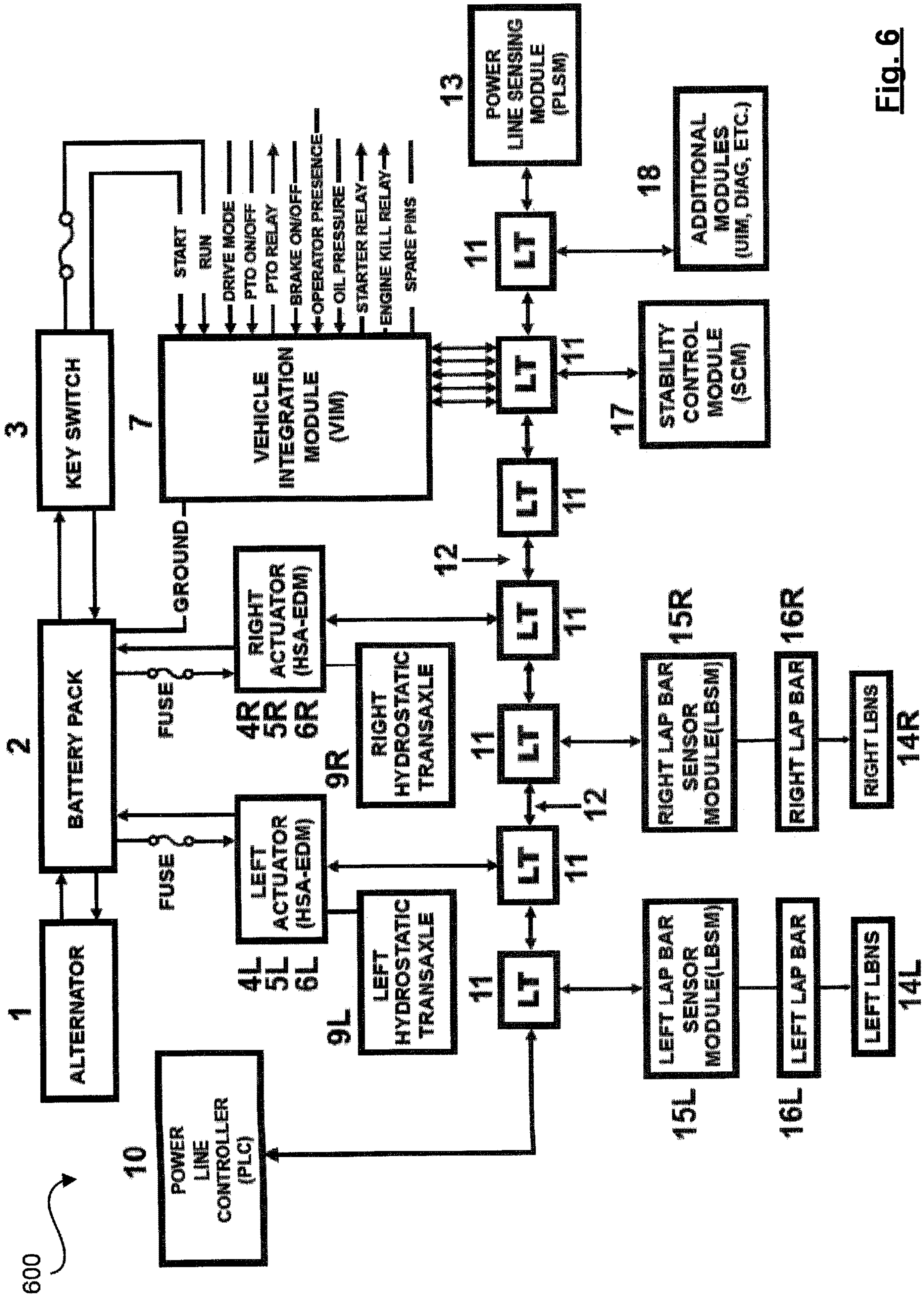
FIG. 6 shows a schematic representation of yet another example system for operating an electric vehicle, in accordance with a non-limiting implementation of the present specification.

FIG. 6 shows a schematic representation of an example system 600 for operating an electric vehicle. System 600 is similar to systems 200, 300, 400, and 500 in that system 600 comprises a power line 12 as a communication backbone, to which backbone various components of the electric vehicle are connected. The electric vehicle components may include a battery pack 2 with a plurality of rechargeable batteries, such as lithium-ion batteries or nickel-metal-hydride batteries. The electric vehicle may be a car, a golf cart, a riding lawn mower, or another vehicle having movement means, such as wheels, powered by the rechargeable batteries 2. System 600 also comprises alternator 1, key-switch 3, left and right actuators 4L, 5L, 6L and corresponding 4R, 5R, 6R. Vehicle Integration Module (VIM) 7 provides features, functions, and controls such as START, RUN, DRIVE MODE, BRAKES, and ENGINE KILL INSTANTANEOUS SWITCH. It is contemplated that in some examples, the VIM may perform the functions of a VCM and vice versa. In some examples, the VIM and the VCM may be interchangeable. System 600 may also comprise left and right hydrostatic transaxles 9L and 9R. System 600 uses the power line to communicate among the components of the electric vehicle connected to the power line.

Other peripherals 11 may have additional features and may be capable of being added or connected to the power line to send and receive messages in the form of data packets. Power line cables 12 comprise GND and VCC wires. Left Lap Bar Sensor (LBNS) 14L and Right Lap Bar Sensor (RBNS) 14R together with left and right lap bar sensor modules 15L and 15R and left and right lap bars 16L and 16R are also connected to the power line for both energy (power) and communication with other components. Power Line Controller 10 and Power Line Sensing Module 13 may have different feature sets. Power Line Controller (PLC) 10 provides a system level network management and controls of packet transmission, topology, and pilot frequencies used. Power Line Sensing Module 13 monitors power line noise and interference regions, tracks trends in transmission failures, and assigns carrier frequencies to both directions TX (send) and RX (receive) packets for the system. System 600 also comprises mezzanine daughter card outlet. In addition, Stability Control Module (SCM) 17 and possible additional modules 18 may be connected through that port and are operator-defined.

In some examples, methods 100 and the other methods described herein, and systems 200, 300, 400, and 500 and the other systems described herein may also have a functionality or component similar to the power line controller. In addition, in some examples, the functionality of the power line controller may be incorporated into, or performed by, another component connected to the power line, such as the power line sensing module, the VIM (or VCM), and the like.

Figure 7:
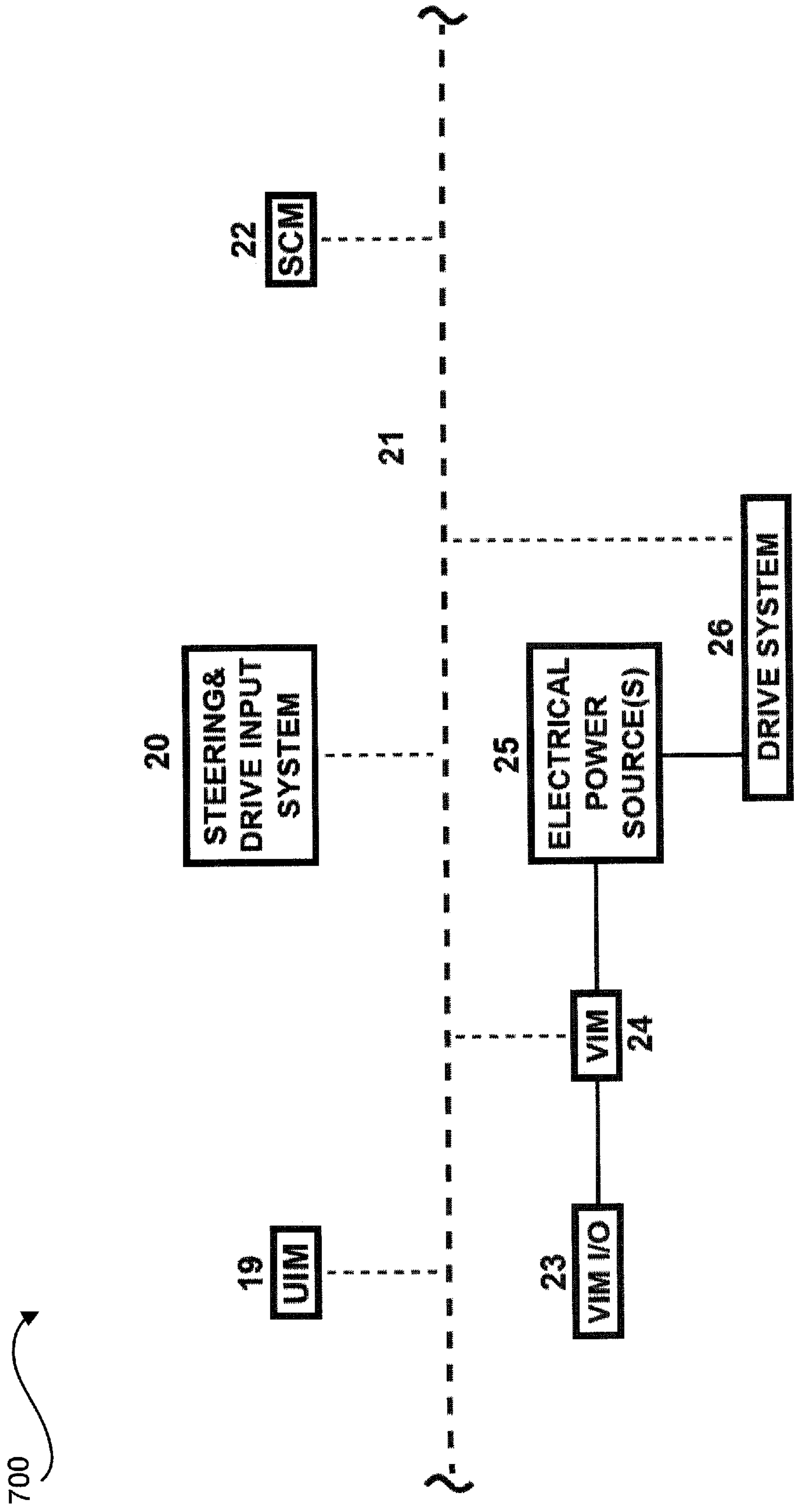
FIG. 7 shows a schematic representation of yet another example system for operating an electric vehicle, in accordance with a non-limiting implementation of the present specification.

FIG. 7 shows a schematic representation of an example system 700 for operating an electric vehicle, which system uses a power line as its communication backbone. System 700 comprises Steering and Drive Input system 20, power line 21 having GND and power (PWR) wires, drive system 26, User Interface Module (UIM) 19, Stability Control Module (SCM) 22, Vehicle Integration Module (VIM) 24 and its input/output (I/O) 23, Electrical Power Source (EPS) 25 such as rechargeable battery pack 2 (shown in FIG. 6), and drive system 26. The power line network configuration allows for additional flexibility of connecting components over multiple inputs and outputs. System 700 may also comprise a key switch connected to power line 21. This key switch may be similar to key switch 3 shown in FIG. 6. The key switch may provide a beginning of a start-up sequence and GND/VCC presence allowing for a power line communication protocol to be enabled shortly after. The power line and its two wires (GND/PWR) may perform two main functions: energy delivery to the entire system, and communication protocol PHY layer for a full duplex (RX/TX) packet distribution.

Figure 8:
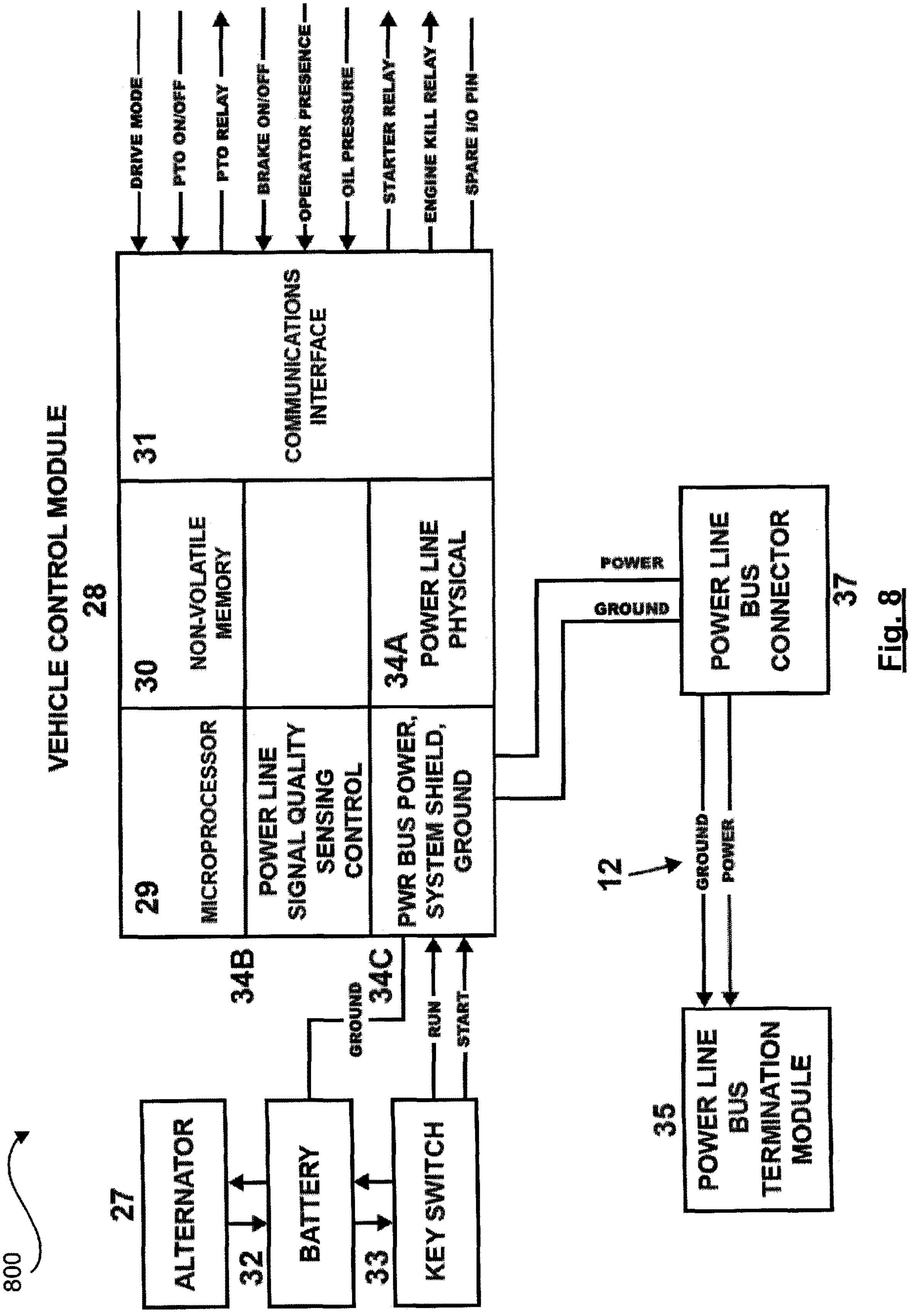
FIG. 8 shows a schematic representation of yet another example system for operating an electric vehicle, in accordance with a non-limiting implementation of the present specification.

Referring to FIG. 8, a schematic representation is shown of an example system 800 for operating an electric vehicle. System 800 comprises Vehicle Control module (VCM) 28, which in turn includes a microprocessor 29, memory 30, communication interface 31, Power Line Signal Quality Sensing Control (PLSQSC) 34B, Power Bus, shield 34C, and Power Line PHY Layer module 34A. The VCM 28 connects directly to the power line 12 via connector 37. Power line bus termination module 35 provides noise tempering, echo cancellation, and a carrier RX/TX avoidance while transferring packets.

System 800 also comprises alternator 27, battery 32, and key switch 33. It is contemplated that in some examples, system 800 may be a component or a subnet of systems 600 or 700. In some such examples, VCM 28 of system 800 may function as, or be the same as, VIM 7 of system 600. In addition, while in FIG. 8 the battery is shown as being connected to the power line via the VCM, it is contemplated that in some examples, the battery and the VCM may each be separately or individually connected to the power line. These connections to the power line may be direct or indirect.

Figure 9:
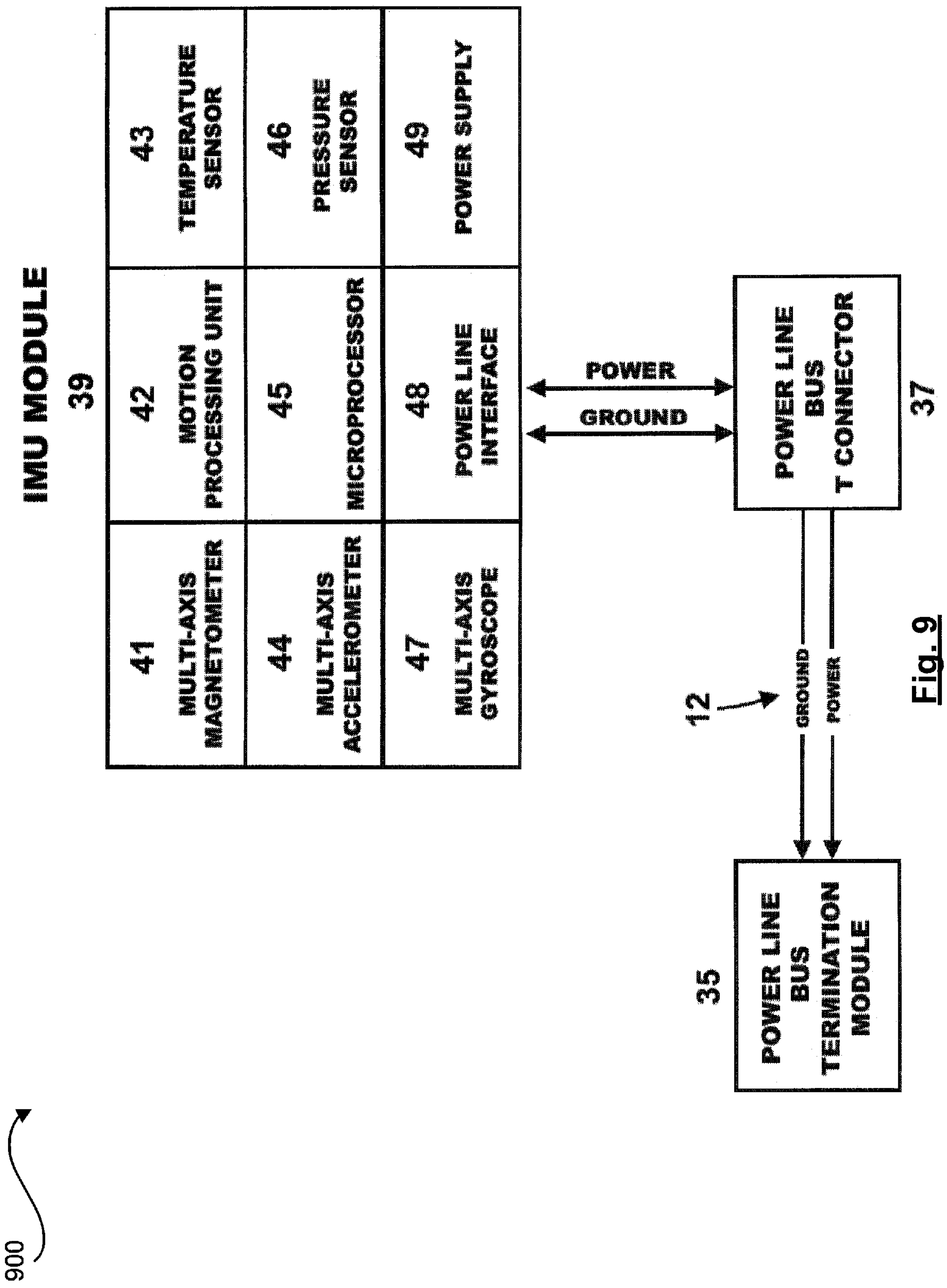
FIG. 9 shows a schematic representation of yet another example system for operating an electric vehicle, in accordance with a non-limiting implementation of the present specification.

Referring to FIG. 9, a schematic representation is shown of an example system 900 for operating an electric vehicle. System 900 comprises Inertial Measurement Unit (IMU) MODULE 39, which includes magnetometer 41, motion processing unit 42, temperature sensor 43, accelerometer 44, microprocessor 45, pressure sensor 46, gyroscope 47, power line interface 48, and power supply 49. IMU 39 connects to the power line 12 via power line connector 37. An end of power line 12 terminates at power line termination module 35. It is contemplated that in some examples, system 900 may be a component or a subnet of systems 600 or 700.

In some examples, the Vehicle Integration Module (VIM) 7 may be part of the electric vehicle platform connecting to one or multiple VCM units. For example, the VIM 7 may be part of a Large Area Network using power line 12 that spans to trailers, external attachments, street power charging stations, hydro infrastructure with its own VCMs, and the like. In some examples, during operation of the electric vehicle, the connecting topology may explore the power line's existing connections to self-assemble an optimal arrangement to avoid a single point of failure in the power line network architecture. When the electric vehicle is turned off, the VIM 7 may transfer operation or management of the power line, or other BUSes such as a CAN BUS, to other blocks connected to the power line network, through a handshake protocol or another state-change process.

Furthermore, in some examples, the VCM 28 may be integrated as part of the battery management system and separate from the electric vehicle power line 12 architecture. Encapsulating the VCM in this way may convert it into a local, battery control module.

In some examples, one or more of the methods and systems described herein may include one or more of the following features and functionality: creating a power line-based network using two physical wires: GND and VCC; autonomously or manually creating multiple connecting nodes having: multiple points with duplicating paths, no single point of failure, self-assembled and/or Ad-Hoc topology, dynamically edited "Best path to deliver" per node and/or per package, communication among nodes that are not next to each other and require a "hop over" or other pass-throughs. Moreover, in some examples, one or more of the methods and systems described herein may include one or more of the following features and functionality: no wires nor electrical harnesses other than the power line needed for inter-vehicle communication; sensing noise regions, monitoring, reporting and avoiding those for packets' delivery; a full duplex (RX/TX) protocol with adjustable parameters, over power line; power line PHY layer agnostic as to what standard is being partitioned into individual packets; and multiple standards supported, such as UART, RS-2xxx, RS-4xx, I2C, SPI, CAN, and the like.

Furthermore, in some examples, one or more of the methods and systems described herein may include one or more of the following features and functionality: the Power Line Noise sensing module connected to GND and PWR. The noise sensing module may have one or more of the following features and functionality: scanning for noise by frequency sweep; scanning for noise by offset sweep, frequency hopping, spread spectrum, and OFDM; generating a 2D noise model, created, saved and used by one or multiple PLNA, Power Line Network Architecture users; selecting a modulation best suited to combat noise, which modulation may be selected by the operator or autonomously selected by the PLNA; a broadcast modulation profile; deploying frequency hopping, by standard ~10 KHz spread or/and other spread; having predefined frequency blocks to synchronize other nodes or components as to which frequency to transition or hop to if needed, for example very 5 KHz, 10 KHz, 25 KHz, and the like.

Moreover, in some examples, one or more of the methods and systems described herein may include one or more of the following features and functionality: absence of, or optional other, wired BUSes or backbones of communication other than the power line; steering, drive, SCM, VIM, Energy source (e.g. battery), drive system and other peripherals communicating over the power line; no "pass through" nor a communication bridge as components of the system communicate and receive power using the power line's 2-wire PHY layer; a self-assembly of the network topography best suited for a current usage and traffic requirements, such as: point to point, star, mesh, hybrid, custom, dynamically changing in real time, and the like; and selecting transmission modulation, packet type, payload and other transmission attributes best suited to combat noise based on dynamically changing noise sources, such as motors, battery charging or depletion, throttle, or other components connected to the power line.

In addition, in some examples, one or more of the methods and systems described herein may include one or more of the following features and functionality: a VCM comprising a communication module for detecting other components connected to the power line; and a controller, such as a VCM, including: a microprocessor, Memory, Communication Interface, Power Line Quality Sensing Control, PWR BUS Power System Shield, GND, and Power Line PHY Layer logic. The VCM may also comprise a communication interface to receive one or more of: Drive mode; PTO On/OFF; PTO Relay; Brakes; Operator's presence; Oil pressure (if applicable); Starter Relay; Engine kill; User programmable I/O pins (GPIO) including Analog, Digital, Power, GND, Custom, and the like. The VCM may be programmed to enable the Power Line Bus Termination Module, which may be both operator-defined or software selectable based on changing noise characteristics or profiles, such as Noise: Yes/NO; where the noise is in frequency domain; where the noise is in DC offset domain; percentile of packets lost due noise calculations; and the like.

In some examples, one or more of the methods and systems described herein may include one or more of the following features and functionality: a Vehicle Control Module (VCM) comprising: a module for detecting if the power is present on the GND/PWR wires of the power line; communication with other devices over power line; and Power Sensing including sensing or reacting to: Key-In switch position; Battery failure; Charging status; Continuous service; Power turned OFF; Power turned ON; managing transitions between power turned ON and OFF by sensing voltage and a Key-In status; pausing message/packet transmission over the power line during transitions between power ON and OFF; and agnostic to voltage presence, absence and levels by a 'self-adjustments' of packets assembled and voltage levels for '0' and '1'.

In addition, in some examples, one or more of the methods and systems described herein may include one or more of the following features and functionality: an IMU comprising: a communication module for detecting other components on the power line; a communication capability with other devices on the power line, such as Power Line Bus Termination Module, VCM, Controllers, motors, accessories, and the like. Such an IMU may include: Magnetometer; Motion Sensing Unit; Temperature sensing; Accelerometer; Gyroscope; Power Supply; Microprocessor; Pressure Sensor; Power Line Interface; and the like.

Glossary of Selected Acronyms

Figure 10:
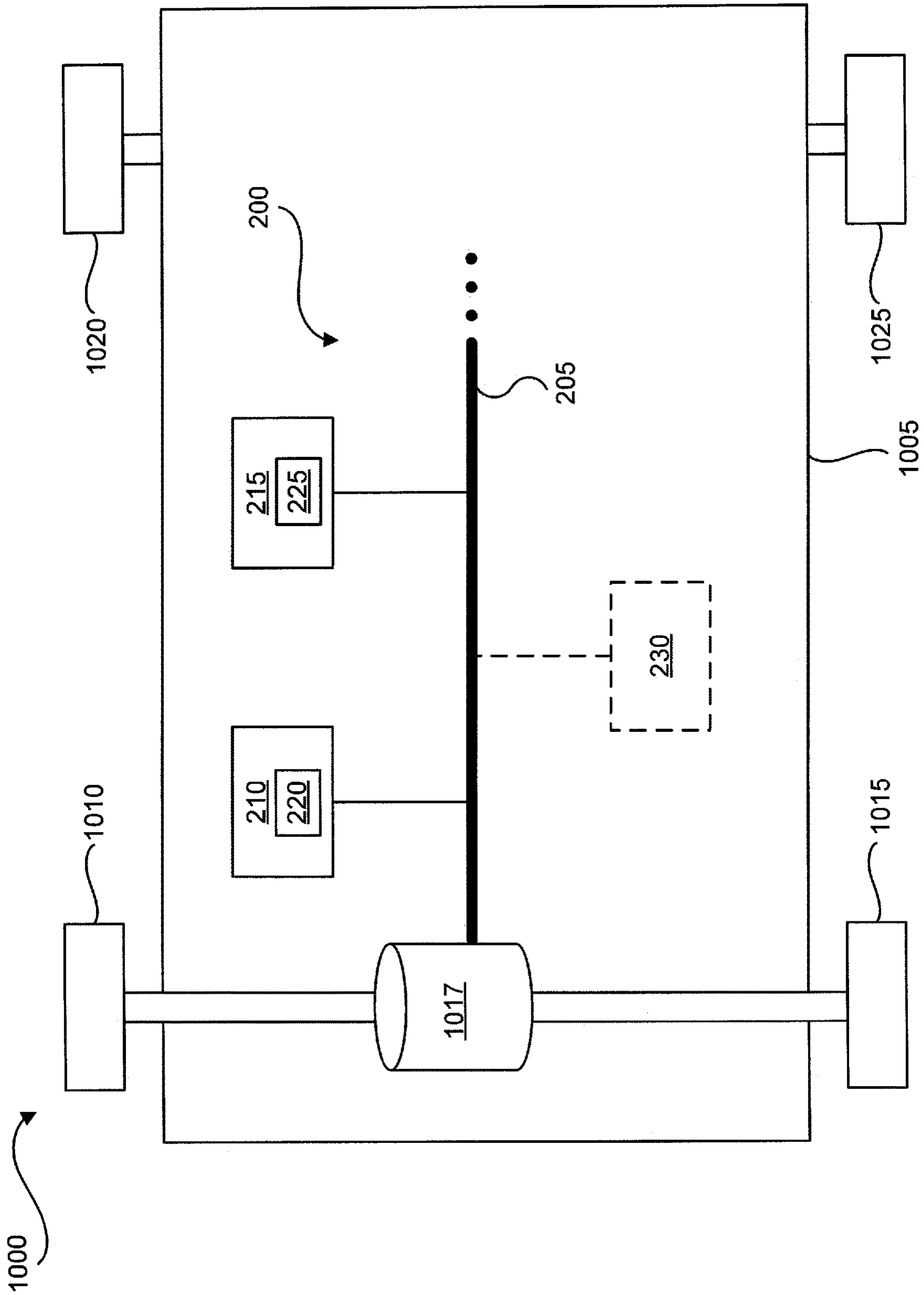
FIG. 10 shows a schematic representation of an example electric vehicle incorporating an example system for operating the electric vehicle, in accordance with a non-limiting implementation of the present specification.

- RS-2xx—Recommended Standard—232, 2xx, etc. for serial communication
- RS-4xx—Recommended Standard—485, 4xx, etc.
- LBNS—Left Lap Bar Sensor
- RBNS—Right Lap Bar Sensor
- SPI—Serial Peripheral Interface (SPI)
- OFDM—Orthogonal Frequency-Division Multiplexing (OFDM)
- PTO Relay—Power Take Off (PTO) Relay Switch
- GPIO—General-Purpose Input/Output (GPIO)
- HSA-EDM—Horizontal Stabilizer Actuator
- DIAG—Diagram Turning now to FIG. 10, a schematic representation is shown of an example electric vehicle 1000, which is operated by system 200. Vehicle 1000 comprises a chassis 1005 and wheels 1010, 1015, 1020, and 1025. An electric motor 1017 may be mechanically coupled to wheels 1010 and 1015 to power those wheels to move or drive vehicle 1000. System 200 may be used to deliver both power to, and low power communication signals to and from, motor 1017 or the other components of vehicle 1000 connected to power line 205. It is also contemplated that in some examples, instead of or in addition to system 200, vehicle 1000 may include or be operated by one or more of systems 300, 400, 500, 600, 700, 800, 900, and the other systems described herein.

In the drawings shown in the figures, the portions of the systems depicted are those portions that are related to the features or functions described herein. It is contemplated that the systems may have additional components which may be used for, or needed to, operate an electric vehicle. In addition, in some examples, each of the methods and systems described herein may have some or all of the features and functions described in relation to any one or more of the other methods and systems described herein.

It should be recognized that features and aspects of the various examples provided herein may be combined into further examples that also fall within the scope of the present disclosure.

The invention claimed is:

1. A method of operating an electric vehicle, the method comprising:

generating, at a first component of the electric vehicle, a message in a first communication protocol;

converting, at a first conversion module associated with the first component, the message into a power line (PL) communication protocol to form a first converted message;

transmitting the first converted message over a power line connecting the first component to a second component of the electric vehicle;

converting, at a second conversion module associated with the second component, the first converted message into a second communication protocol to form a second converted message, the second communication protocol used by the second component; and receiving the second converted message at the second component.

2. The method of claim 1, wherein:

the power line comprises a first wire and a second wire, the first wire and the second wire each being a physical wire; and the transmitting the first converted message over the power line comprises transmitting the first converted message over one or more of the first wire and the second wire.

3. The method of claim 2, wherein:

the power line consists of the first wire and the second wire; and the transmitting the first converted message over the power line comprises transmitting the first converted message over one or more of the first wire and the second wire.

4. The method of claim 2, wherein the first wire is to carry electrical power and the second wire is to function as ground.

5. The method of claim 1, wherein:

the first communication protocol is the same as the second communication protocol; and the second converted message is the same as the message.

6. The method of claim 1, wherein:

one or more of the first communication protocol and the second communication protocol comprise a Controller Area Network (CAN) protocol.

7. The method of claim 1, further comprising:

determining, at a power line sensing module in communication with the power line, a noise region of noise associated with the power line, the noise region comprising one or more of: a frequency of the noise, an amplitude of the noise, and a change of a noise attribute of the noise over time.

8. The method of claim 7, further comprising:

changing a message attribute of one or more of the message, the first converted message, and the second converted message to avoid the noise region.

9. The method of claim 8, wherein:

the message attribute comprises a carrier frequency; and the changing the message attribute comprises changing the carrier frequency.

10. The method of claim 1, further comprising:

providing electrical power via the power line to one or more of the first component and the second component.

11. A system for operating an electric vehicle, the system comprising:

a first component of the electric vehicle, the first component to generate a message in a first communication protocol;

a first conversion module associated with the first component, the first conversion module to convert the message into a power line (PL) communication protocol to form a first converted message;

a power line connecting the first component to a second component of the electric vehicle, the power line to transmit the first converted message; and a second conversion module associated with the second component, the second conversion module to convert the first converted message into a second communication protocol to form a second converted message, the second communication protocol used by the second component;

wherein the second component is to receive the second converted message.

12. The system of claim 11, wherein:

the power line comprises a first wire and a second wire, the first wire and the second wire each being a physical wire.

13. The system of claim 12, wherein:

the power line consists of the first wire and the second wire.

14. The system of claim 12, wherein the first wire is to carry electrical power and the second wire is to function as ground.

15. The system of claim 11, wherein:

the first communication protocol is the same as the second communication protocol; and the second converted message is the same as the message.

16. The system of claim 11, wherein:

one or more of the first communication protocol and the second communication protocol comprise a Controller Area Network (CAN) protocol.

17. The system of claim 11, further comprising:

a power line sensing module in communication with the power line, the power line sensing module to determine a noise region of noise associated with the power line, the noise region comprising one or more of: a frequency of the noise, an amplitude of the noise, and a change of a noise attribute of the noise over time.

18. The system of claim 17, wherein:

the power line sensing module is further to direct a change in a message attribute of one or more of the message, the first converted message, and the second converted message to avoid the noise region.

19. The system of claim 18, wherein:

the message attribute comprises a carrier frequency.

20. The system of claim 17, wherein:

one of the first component and the second component comprises a first subnet having a first BUS and one or more corresponding components connected to the first BUS; and the other one of the first component and the second component comprises a second subnet having a second BUS and one or more corresponding components connected to the second BUS.

21. The systems of claim 20, wherein:

the first subnet is associated with an electric motor of the electric vehicle; and the second subnet is associated with one or more peripherals of the electric vehicle.

22. The system of claim 21, wherein:

the noise originates from the first subnet; and the power line sensing module is further to direct a change in a message attribute of one or more of the message, the first converted message, and the second converted message to avoid the noise region.

23. The system of claim 11, wherein:

one or more of the first component and the second component are to receive electrical power via the power line.

* * * * *